United States Patent
Zhang et al.

(10) Patent No.: US 12,183,839 B2
(45) Date of Patent: Dec. 31, 2024

(54) LAMINATED PASSIVATION STRUCTURE OF SOLAR CELL AND PREPARATION METHOD THEREOF

(71) Applicant: Trina Solar Co., Ltd., Jiangsu (CN)

(72) Inventors: Xueling Zhang, Jiangsu (CN); Wei Liu, Jiangsu (CN); Hong Chen, Jiangsu (CN); Lei Jian, Jiangsu (CN); Yifeng Chen, Jiangsu (CN)

(73) Assignee: Trina Solar Co., Ltd., Jiangsu (CN)

( * ) Notice: Subject to any disclaimer, the term of this patent is extended or adjusted under 35 U.S.C. 154(b) by 469 days.

(21) Appl. No.: 17/430,951

(22) PCT Filed: May 21, 2021

(86) PCT No.: PCT/CN2021/095127
§ 371 (c)(1),
(2) Date: Aug. 13, 2021

(87) PCT Pub. No.: WO2022/156101
PCT Pub. Date: Jul. 28, 2022

(65) Prior Publication Data
US 2023/0361227 A1    Nov. 9, 2023

(30) Foreign Application Priority Data

Jan. 19, 2021 (CN) ............ 202110065887.2
Apr. 14, 2021 (CN) ............ 202110396613.1

(51) Int. Cl.
*H01L 31/0216* (2014.01)
*H01L 31/18* (2006.01)

(52) U.S. Cl.
CPC ........ *H01L 31/02167* (2013.01); *H01L 31/18* (2013.01)

(58) Field of Classification Search
CPC .......... H01L 31/1868; H01L 31/02168; H01L 31/02167
See application file for complete search history.

(56) References Cited

U.S. PATENT DOCUMENTS 10,991,838 B1 * 4/2021 Yang ............... H01L 31/0543
2011/0100424 A1 * 5/2011 Roche ............. H01L 31/02168
136/246

(Continued)

FOREIGN PATENT DOCUMENTS

CN    109087951 A    12/2018
CN    109087956 A *  12/2018 ....... H01L 31/02167

(Continued)

OTHER PUBLICATIONS

Machine translation of CN-109087956-A, Chen J. (Year: 2018).*

(Continued)

*Primary Examiner* — Mayla Gonzalez Ramos
(74) *Attorney, Agent, or Firm* — Taft Stettinius & Hollister LLP

(57) ABSTRACT

A laminated passivation structure of solar cell and a preparation method thereof are disclosed herein. The laminated passivation structure of solar cell includes a P-type silicon substrate, a first dielectric layer, a second dielectric layer, a third dielectric layer and a fourth dielectric layer sequentially arranged on the back surface of the P-type silicon substrate from inside to outside. The preparation method includes generating a first dielectric layer on the back surface of the P-type silicon substrate, and then sequentially depositing a second dielectric layer, a third dielectric layer and a fourth dielectric layer on the first dielectric layer.

43 Claims, 5 Drawing Sheets

(56) References Cited

U.S. PATENT DOCUMENTS

| | | | | |
|---|---|---|---|---|
| 2011/0240114 A1* | 10/2011 | Stewart | ................ | H01L 31/068 |
| | | | | 136/258 |
| 2013/0118571 A1* | 5/2013 | Shim | ................ | H01L 31/02363 |
| | | | | 257/E31.124 |
| 2021/0217907 A1* | 7/2021 | Chen | .................... | H01L 31/068 |

FOREIGN PATENT DOCUMENTS

| | | | |
|---|---|---|---|
| CN | 109994553 | A | 7/2019 |
| CN | 110112241 | A | 8/2019 |
| CN | 110112243 | A | 8/2019 |
| CN | 109216473 | B | 10/2019 |
| CN | 110690296 | A | 1/2020 |
| CN | 111029436 | A | 4/2020 |
| CN | 111987191 | A | 11/2020 |
| CN | 211929505 | U | 11/2020 |
| CN | 112713203 | A | 4/2021 |
| WO | 2019242761 | A1 | 12/2019 |

OTHER PUBLICATIONS

International Search Report; China National Intellectual Property Administration; Patent Application No. PCT/CN2021/095127; Oct. 21, 2021; 4 pages.
Written Opinion of the International Searching Authority; China National Intellectual Property Administration; Patent Application No. PCT/CN2021/095127; Oct. 21, 2021; 4 pages.
European Search Report for corresponding Application No. EP 21751735 dated May 24, 2023, 8 pages.
Chinese Search Report for corresponding Application No. 2021800085826 dated Jul. 14, 2023, 2 pages.
Chinese Office Action for corresponding Application No. 202180008582.6 dated Jul. 29, 2023, 6 pages.

\* cited by examiner

LAMINATED PASSIVATION STRUCTURE OF SOLAR CELL AND PREPARATION METHOD THEREOF

CROSS REFERENCE TO RELATED APPLICATIONS

This application is a U.S. national stage filing of International Patent Application No. PCT/CN2021/095127 filed May 21, 2021, which claims priority to Chinese Application No. 202110065887.2 filed Jan. 19, 2021 and also claims priority to Chinese Application No. 202110396613.1 filed Apr. 14, 2021, the contents of each application hereby incorporated by reference in their entirety.

TECHNICAL FIELD

The present application pertains to the technical field of photovoltaics, and relates to a laminated passivation structure of a solar cell and the preparation method thereof.

BACKGROUND

Solar energy is an inexhaustible renewable energy source for human beings. Among the effective utilization of solar energy, solar photovoltaic utilization is the fastest growing and most dynamic research field in recent years, and it is one of the most high-profile projects. Monocrystalline silicon solar cells have the highest conversion efficiency and technologies as well as being the most mature. For traditional P-type all-aluminum back-field solar cells, recombination at the back-surface metal and silicon contact area, that is, the formation of the all-aluminum back field by the all-aluminum doping on the back surface is the key factor limiting the further improvement of efficiency. At the same time, the all-aluminum back field has lower long-wave reflectivity and higher optical loss. In order to solve such problems, major research institutions at home and abroad focus on the passivation treatment and structural improvement of the surface of high-efficiency cells. By introducing back passivation film and local aluminum back field technology, recombination at the metal and silicon contact interface is reduced while increasing the long-wave reflection of the back surface, thereby greatly improving the open-circuit voltage (Voc) and short-circuit current (Isc) of the cells, and the photoelectric conversion efficiency of solar cells is increased by 1% or more for P-type passivated emitter and rear cell (PERC) solar cells. The process route is relatively simple and compatible with existing cell production lines. Therefore, it has been quickly promoted and applied on a large scale, and currently, the market share of PERC cells has reached 90% or more. At present, the conversion efficiency of mass-produced PERC cells has reached about 23%. In order to further improve the conversion efficiency of PERC cells, the surface of the cells must be well passivated to reduce the surface recombination and increase the open-circuit voltage of the cells.

At present, the most common passivation technology for industrialized PERC cells is a silicon nitride ($SiN_x$) passivation film on the front surface, and a laminated passivation of aluminum oxide and silicon nitride on the back surface.

CN111987191A discloses a method for repairing laser film opening damage of PERC cells, comprising texturing the front and back surfaces of a P-type monocrystalline silicon wafer, and performing phosphorus diffusion on the front and/or back surfaces to form a phosphorus-doped surface; locally doping the front surface of the P-type monocrystalline silicon wafer by a laser to produce a selective emitter; after backside etching, thermal oxidation, depositing a laminate of aluminum oxide ($Al_2O_3$) and silicon nitride or a laminate of silicon nitride and silicon oxynitride ($SiO_xN_y$) on the back surface and depositing a passivation anti-reflection layer on the front surface, performing laser film opening and damage repair, realizing the solid phase epitaxial growth of the damaged area, and recrystallizing the crystalline silicon to restore an orderly arrangement.

CN211929505U discloses a crystalline silicon solar cell, wherein the passivation layer is a laminate of an aluminum oxide layer and a silicon nitride layer, and the passivation layer has a thickness of 110 nm to 140 nm, and the silicon nitride layer is arranged on the bottom surface of the aluminum oxide layer.

The current industrialized PERC cells are based on the result of the laminated passivation of aluminum oxide and silicon nitride on the back surface. The positive charge of the silicon nitride film is relatively high, which will affect the field passivation effect of the negatively charged aluminum oxide film. Meanwhile the deposition power of the silicon nitride film is higher than that of the aluminum oxide film, and the passivation effect of the aluminum oxide film will be damaged during the deposition process. In addition, the refractive index of the aluminum oxide film is about 1.6, and the refractive index of the silicon nitride film is about 2.0, there is a big difference in the refractive index between the two, resulting in a poor back-surface light reflection effect. Therefore, the chemical passivation effect, the field passivation effect, and the back-surface light reflection ability of the above solutions need to be further improved.

SUMMARY

The objective of the present application is to offer a laminated passivation structure of solar cell and the preparation method thereof. The laminated passivation structure of solar cell provided by the present application has a good passivation effect.

To achieve this objective, the present application adopts the following technical solutions:

In a first aspect, the present application provides a laminated passivation structure of a solar cell. The laminated passivation structure of the solar cell comprises a P-type silicon substrate, and a first dielectric layer, a second dielectric layer, a third dielectric layer and a fourth dielectric layer sequentially arranged on the back surface of the P-type silicon substrate from inside to outside.

In the laminated passivation structure of the solar cell provided in the present application, the first dielectric layer functions to reduce the density of the dangling bonds of the film, which has good control of the interface traps and results in a chemical passivation effect. The second dielectric layer functions due to a large amount of hydrogen in the film during the deposition of the film, which can form a chemical passivation on the surface of the silicon wafer, and in addition, the contact surface between the film and the silicon has a high fixed negative charge density, which can show good field passivation characteristics by shielding a few carriers-electrons on the surface of the P-type silicon. The third dielectric layer and the fourth dielectric layer have similar functions, but the refractive index of the third dielectric layer is between that of the second dielectric layer and that of the fourth dielectric layer, such a film layer design can better increase the light reflection on the back surface and increase the current; in addition, the positive charge density of the third dielectric layer is lower than that of the fourth dielectric layer, which can weaken the influence on the negative charge of the second dielectric layer, that is, weaken the influence on the field passivation effect. There are a large number of free hydrogen atoms and hydrogen ions in the third dielectric layer and the fourth dielectric layer, which can diffuse to the silicon-silicon oxide interface, combine with the silicon dangling bonds at the interface, and reduce the interface state density of the surface to achieve the effect of reducing the surface recombination rate to passivate the surface of the cells. At the same time, hydrogen will also diffuse into the bulk of the silicon wafer to passivate defects and impurities in the bulk of the silicon wafer.

In the back-surface laminated passivation structure provided by the present application, in this embodiment, the laminated film on the back surface of the P-type silicon substrate contains a large amount of hydrogen ions or atoms, which will be injected into the surface and interior of the silicon wafer during the subsequent annealing process or sintering process, so that the recombination center is passivated. The laminated passivation film has a strong field passivation effect. Therefore, the passivation structure of solar cell of the present application has a good passivation effect.

The following are optional technical solutions for the present application, but not as limitations to the technical solutions provided by the present application. Through the following optional technical solutions, the technical objectives and beneficial effects of the present application can be better achieved and realized.

As an optional technical solution for the present application, the first dielectric layer comprises a silicon-containing layer.

Optionally, the first dielectric layer is a silicon oxide ($SiO_x$) layer and/or a silicon oxynitride layer.

Optionally, the thickness of the first dielectric layer is 1-10 nm, for example, 1 nm, 2 nm, 3 nm, 4 nm, 5 nm, 6 nm, 7 nm, 8 nm, 9 nm, or 10 nm, etc.

In the present application, if the thickness of the first dielectric layer is too thin, the chemical passivation effect will be unstable; if the thickness of the first dielectric layer is too thick, it will shield the negative charge carriers of the second dielectric layer, resulting in a weakened field passivation effect thereof.

As an optional technical solution of the present application, the second dielectric layer comprises an aluminum-containing layer.

Optionally, the second dielectric layer is an aluminum oxide layer.

Optionally, the thickness of the second dielectric layer is 1 to 60 nm, for example, 1 nm, 5 nm, 10 nm, 20 nm, 30 nm, 40 nm, 50 nm or 60 nm, etc.

Optionally, the second dielectric layer is deposited by a Plasma Enhanced Chemical Vapor Deposition (PECVD) method or an Atomic Layer Deposition (ALD) method, with a thickness of 1 to 50 nm.

In the present application, if the thickness of the second dielectric layer is too thin, the field passivation effect will be weakened or become unstable; if the thickness of the second dielectric layer is too thick, the back reflection effect of the laminated film will be weakened, meanwhile the production cost will be increased as well.

As an optional technical solution of the present application, the third dielectric layer comprises a silicon-containing layer.

Optionally, the third dielectric layer is any one or a combination of at least two of a silicon oxide layer, a silicon oxynitride layer, a silicon nitride layer, and a silicon carbide layer.

Optionally, the thickness of the third dielectric layer is 1 to 80 nm, for example, 1 nm, 10 nm, 20 nm, 30 nm, 40 nm, 50 nm, 60 nm, 70 nm, or 80 nm, etc.

In the present application, if the thickness of the third dielectric layer is too thick, a high-energy laser is required for the back-surface laser grooving. The high energy of the laser causes a reduction in the bulk lifetime of the silicon wafer and reduces the conversion efficiency of the cells. If the thickness of the third dielectric layer is too thick or too thin, the back reflection effect will also be weakened at the same time.

Optionally, the third dielectric layer is deposited by a PECVD method with a thickness of 1 to 80 nm.

Optionally, the refractive index of the third dielectric layer is 1.5 to 2.4, for example, 1.5, 1.6, 1.8, 2, 2.2 or 2.4. etc.

Optionally, the third dielectric layer is a laminated film structure with different refractive indexes.

Optionally, the third dielectric layer is a laminated film structure of silicon oxynitride with a refractive index ranging from 1.6 to 2.2 and silicon oxynitride with a refractive index ranging from 1.7 to 2.4.

Optionally, the third dielectric layer is a laminated film structure of silicon oxynitride with a refractive index ranging from 1.6 to 2.2 and silicon carbide with a refractive index ranging from 1.7 to 2.4.

Optionally, in the laminated film structure of the third dielectric layer, along a direction away from the P-type silicon substrate, the refractive indexes of each film of the laminated film increase in sequence.

In the present application, the use of a laminated film with such an arrangement of refractive index in the third dielectric layer can increase the short-circuit current. This is because the laminated film structure with high-low refractive index arrangement can enhance the back-surface light reflection and ensure the absorption and utilization of the long-wavelength light.

Exemplarily, the laminated film structure of the third dielectric layer may be a three-layer film structure, and along the direction away from the P-type silicon substrate there are a first film of the third dielectric layer, a second film of the third dielectric layer, and a third film of the third dielectric layer, respectively. The refractive index of the first film of the third dielectric layer is 1.5 to 2.2, the refractive index of the second film of the third dielectric layer is 1.6 to 2.3, and the refractive index of the third film of the third dielectric layer is 1.7 to 2.4.

As an optional technical solution of the present application, the fourth dielectric layer comprises a silicon-containing layer.

Optionally, the fourth dielectric layer is any one or a combination of at least two of a silicon oxide layer, a silicon oxynitride layer, a silicon nitride layer, and a silicon carbide layer.

Optionally, the thickness of the fourth dielectric layer is 1 to 200 nm, for example, 20 nm, 50 nm, 70 nm, 80 nm, 90 nm, 100 nm, 125 nm, 150 nm, 175 nm or 200 nm, etc.

In the present application, if the thickness of the fourth dielectric layer is too thin, the blocking effect of the film on the corrosiveness of the back aluminum paste or silver (Ag) paste will be weakened, and the passivation effect of the laminated film will be affected. If the thickness of the fourth dielectric layer is too thick, a high-energy laser is required for the back-surface laser grooving. The high energy of the laser causes a reduction in the bulk lifetime of the silicon wafer and reduces the conversion efficiency of the cells. If the thickness of film is too thick or too thin, the back reflection effect will also be weakened at the same time.

Optionally, the fourth dielectric layer is a $SiN_x$ film deposited by a PECVD method, and has a thickness of 20 to 150 nm.

Optionally, the refractive index of the fourth dielectric layer is 1.5 to 2.4, for example, 1.5, 1.6, 1.7, 1.8, 1.9, 2.0, 2.1, 2.2, 2.3 or 2.4, etc.

Optionally, the fourth dielectric layer is a laminated film structure with different refractive indexes.

Optionally, the fourth dielectric layer is a laminated film structure of silicon nitride with a refractive index ranging from 1.6 to 2.2 and silicon nitride with a refractive index ranging from 1.9 to 2.4.

Optionally, the fourth dielectric layer is a laminated film structure of silicon oxynitride with a refractive index ranging from 1.6 to 2.2 and silicon nitride with a refractive index ranging from 1.9 to 2.4. Optionally, in the laminated film structure of the fourth dielectric layer, along a direction away from the P-type silicon substrate, the refractive indexes of each film of the laminated film increase in sequence.

In the present application, the use of a laminated film with such an arrangement of refractive index in the fourth dielectric layer can increase the short-circuit current. This is because the laminated film structure with high-low refractive index arrangement can enhance the back-surface light reflection and ensure the absorption and utilization of the long-wavelength light.

Exemplarily, the laminated film structure of the fourth dielectric layer may be a three-layer film structure, and along the direction away from the P-type silicon substrate there are a first film of the fourth dielectric layer, a second film of the fourth dielectric layer, and a third film of the fourth dielectric layer, respectively. The refractive index of the first film of the fourth dielectric layer is 1.5 to 2.2, the refractive index of the second film of the fourth dielectric layer is 1.6 to 2.3, and the refractive index of the third film of the fourth dielectric layer is 1.7 to 2.4.

Optionally, the refractive index of the third dielectric layer is smaller than the refractive index of the fourth dielectric layer.

As an optional technical solution of the present application, in the laminated passivation structure of solar cell, the first dielectric layer is a $SiO_2$ film, the second dielectric layer is an $Al_2O_3$ layer, the third dielectric layer is a $SiO_xN_y$ film, and the fourth dielectric layer is a $SiN_x$ film.

Optionally, the thickness of the $SiO_2$ film is 1 to 10 nm.

Optionally, the $Al_2O_3$ layer is deposited by a PECVD method or an ALD method, and has a thickness of 1 to 50 nm.

Optionally, the $SiO_xN_y$ film is deposited by a PECVD method, and has a thickness of 1 to 80 nm.

Optionally, the $SiN_x$ film is a $SiN_x$ film deposited by a PECVD method, and has a thickness of 20 to 150 nm.

Optionally, the $SiO_2$ film has a thickness of 1 to 5 nm, the $Al_2O_3$ layer is deposited by a PECVD method or an ALD method, and has a thickness of 1 to 50 nm, the $SiO_xN_y$ film is deposited by a PECVD method, and has a thickness of 1 to 80 nm, and the $SiN_x$ film is a $SiN_x$ film deposited by a PECVD method, and has a thickness of 20 to 150 nm.

As an optional technical solution of the present application, the first dielectric layer is a silicon oxide layer with a thickness of 1 to 10 nm, the second dielectric layer is an aluminum oxide layer with a thickness of 1 to 60 nm, the third dielectric layer is a silicon oxynitride layer with a thickness of 1 to 80 nm, and the fourth dielectric layer is a silicon nitride layer with a thickness of 1 to 100 nm.

Optionally, the first dielectric layer is a silicon oxide layer with a thickness of 1 to 10 nm, the second dielectric layer is an aluminum oxide layer with a thickness of 1 to 60 nm, the third dielectric layer is a silicon carbide layer with a thickness of 1 to 80 nm, and the fourth dielectric layer is a silicon nitride layer with a thickness of 1 to 100 nm.

As an optional technical solution of the present application, the laminated passivation structure of solar cell further comprises a $N^{++}$ heavily diffused region and a $N^+$ lightly diffused region, a fifth dielectric layer and a sixth dielectric layer sequentially arranged on the front surface of the P-type silicon substrate from inside to outside.

In the present application, the $N^+$ lightly diffused region refers to a region with a relatively low phosphorus concentration formed by phosphorus doping, and the $N^{++}$ heavily diffused region refers to a region with a relatively high phosphorus doping concentration formed by laser doping or high-temperature diffusion in order to obtain a better metal contact resistance and a lower recombination current in the metal zone.

Optionally, the fifth dielectric layer is a silicon oxide layer.

Optionally, the thickness of the fifth dielectric layer is 1 to 10 nm, for example, 1 nm, 2 nm, 5 nm, 8 nm, or 10 nm, etc.

Optionally, the sixth dielectric layer is any one or a combination of at least two of a silicon oxide layer, a silicon oxynitride layer, a silicon nitride layer, and a silicon carbide layer.

Optionally, the thickness of the sixth dielectric layer is 50 to 150 nm, for example, 50 nm, 100 nm, or 150 nm, etc.

Optionally, the laminated passivation structure of solar cell further comprises a front Ag electrode contacting with the $N^{++}$ heavily diffused region through the sixth dielectric layer and the fifth dielectric layer.

Optionally, the laminated passivation structure of solar cell further comprises an aluminum back field connecting with the P-type silicon substrate 1 after passing through the fourth dielectric layer, the third dielectric layer, the second dielectric layer and the first dielectric layer in sequence.

In a second aspect, the present application provides a method for preparing the laminated passivation structure of solar cell as described in the first aspect, and the method comprises the following steps:

oxidizing the back surface of the P-type silicon substrate to grow a first dielectric layer, and then sequentially depositing a second dielectric layer, a third dielectric layer and a fourth dielectric layer on the first dielectric layer.

The method provided by the present application has a simple operation, a short process, a low cost, and is easy to carry out large-scale industrial production, which can make the laminated passivation structure of solar cell provided in the first aspect have a good industrialization prospect.

As an optional technical solution of the present application, the growth method of the first dielectric layer comprises any one or a combination of at least two of a thermal oxidation method, a solution method or a PECVD method.

If the first dielectric layer is a silicon oxide film, the growth method can be a thermal oxidation, a solution method or a plasma enhanced chemical vapor deposition; if the first dielectric layer is a silicon oxide/silicon oxynitride film, the growth method of the silicon oxide film can be a thermal oxidation method, a solution method or a plasma enhanced chemical vapor deposition method; and the growth method of the silicon oxynitride film is a plasma enhanced chemical vapor deposition method.

Optionally, the second dielectric layer is deposited by plasma enhanced chemical vapor deposition (PECVD) or an atomic layer deposition (ALD).

Optionally, the third dielectric layer is deposited by plasma enhanced chemical vapor deposition (PECVD) or an atomic layer deposition (ALD).

Optionally, the fourth dielectric layer is deposited by plasma enhanced chemical vapor deposition (PECVD) or an atomic layer deposition (ALD).

Optionally, the method further comprises: preparing a $N^{++}$ heavily diffused region and a $N^+$ lightly diffused region, and depositing a fifth dielectric layer and a sixth dielectric layer.

Optionally, the fifth dielectric layer is deposited by plasma enhanced chemical vapor deposition.

Optionally, the sixth dielectric layer is deposited by plasma enhanced chemical vapor deposition.

As a further optional technical solution of the preparation method described in the present application, the method comprises the following steps:

removing a mechanical damaged layer of a P-type silicon substrate with an alkaline etching solution, and then etching the surface of the silicon substrate by use of the alkaline etching solution to form a pyramid structure on the front surface of the P-type silicon substrate; after that, performing diffusion to form a $N^+$ lightly diffused region on the front surface of the P-type silicon substrate, and performing laser doping to obtain a $N^{++}$ heavily diffused region; removing the back junction of the P-type silicon substrate, and polishing the back surface of the P-type silicon substrate; oxidation generating a first dielectric layer and a fifth dielectric layer on the P-type silicon substrate, and then sequentially depositing a second dielectric layer, a third dielectric layer and a fourth dielectric layer on the first dielectric layer, and depositing a sixth dielectric layer on the fifth dielectric layer; printing a back Ag electrode and drying, then printing a back Al paste to form an aluminum back field, and printing a front Ag electrode.

Compared with the prior art, the present application has the following beneficial effects:

The laminated passivation structure of solar cell provided by the present application can effectively exert the field passivation effect of the negative charge of the film, and the chemical passivation effect of the interface film is good. At the same time, the back-surface light reflection effect of the cell is greatly enhanced through the optimization of the refractive indexes of each dielectric film. The laminated passivation structure of solar cell provided by the present application has an open-circuit voltage of 694 mV or more, a short-circuit current of 40.80 mA/cm² or more, and a conversion efficiency of 23.08% or more. Therefore, the laminated passivation structure of solar cell of the present application has a good passivation effect and light reflection effect.

wherein:
1—P-type silicon substrate,
2—first dielectric layer,
3—second dielectric layer,
4—third dielectric layer,
5—fourth dielectric layer,
7—sixth dielectric layer,
8—$N^{++}$ heavily diffused region,
9—$N^+$ lightly diffused region,
10—fifth dielectric layer.

Figure 1A:
FIGS. 1A-1H show schematic diagrams of the solar cells in different stages of the preparation method according to Example 1 (the front surface of the cell is a textured structure, and is intentionally drawn as a plane for simple illustration)
Figure 1B:
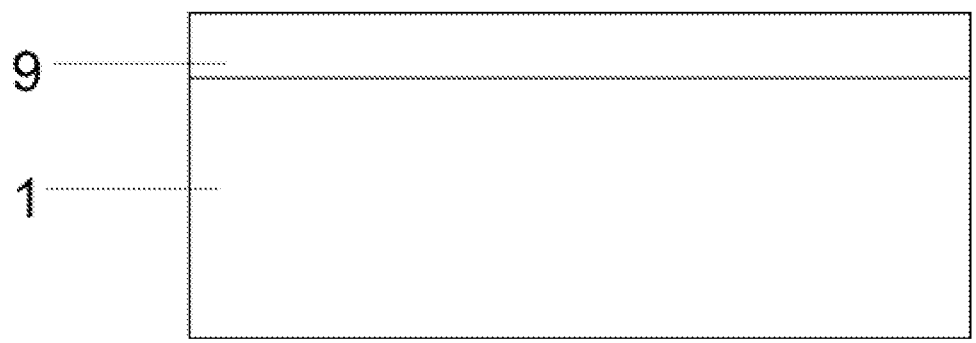
Figure 1C:
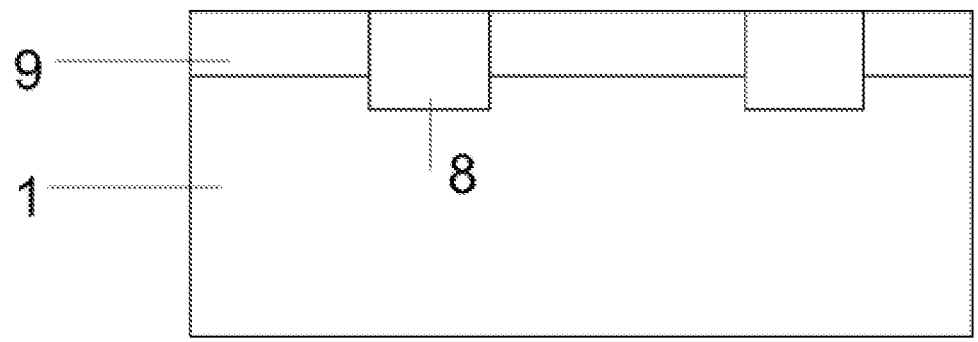
Figure 1D:
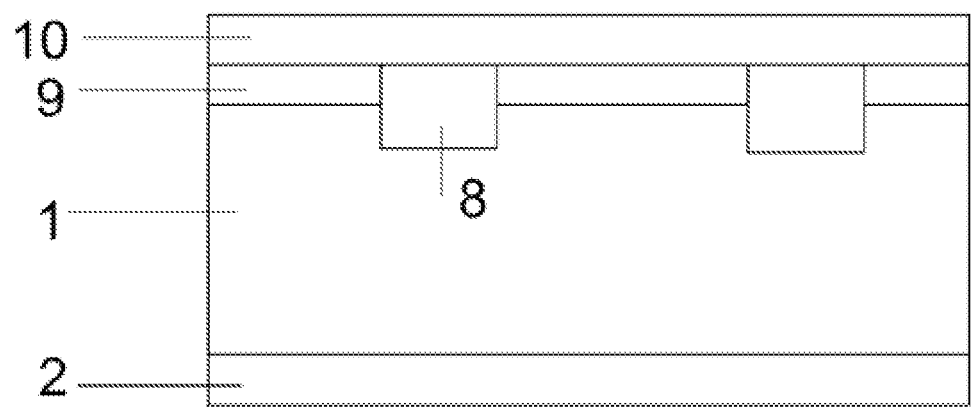
Figure 1E:
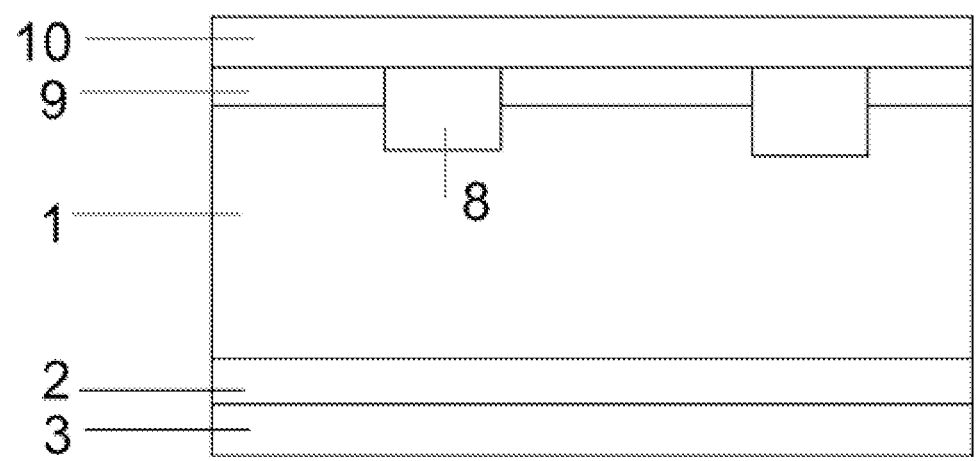
Figure 1F:
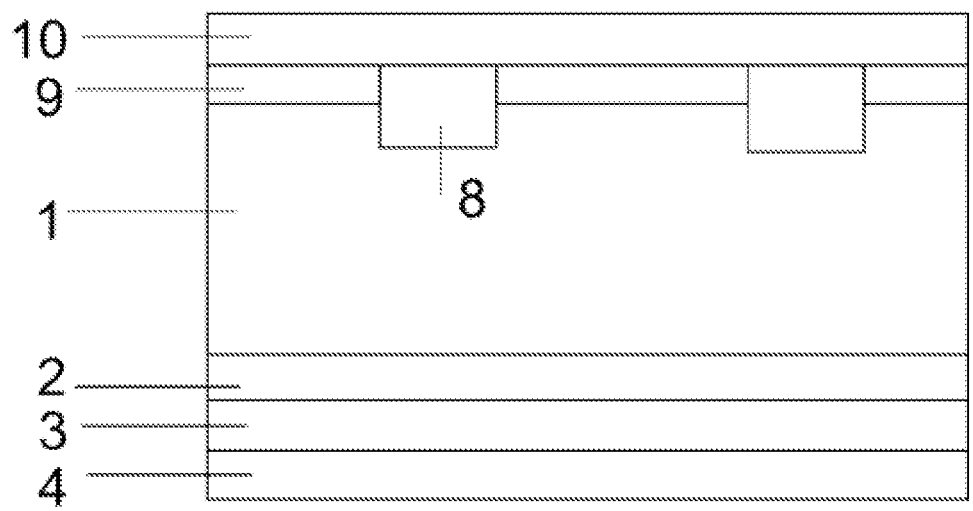
Figure 1G:
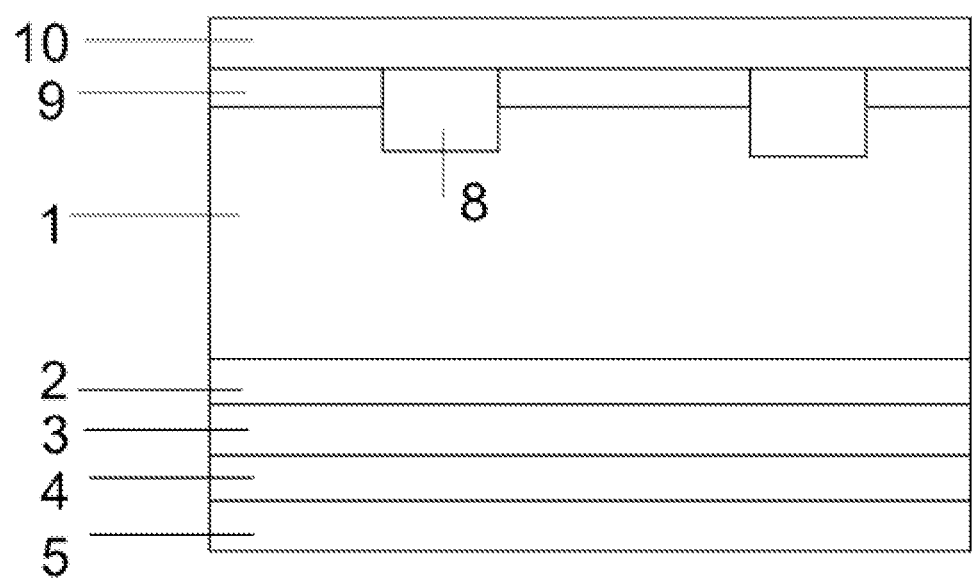
Figure 1H:
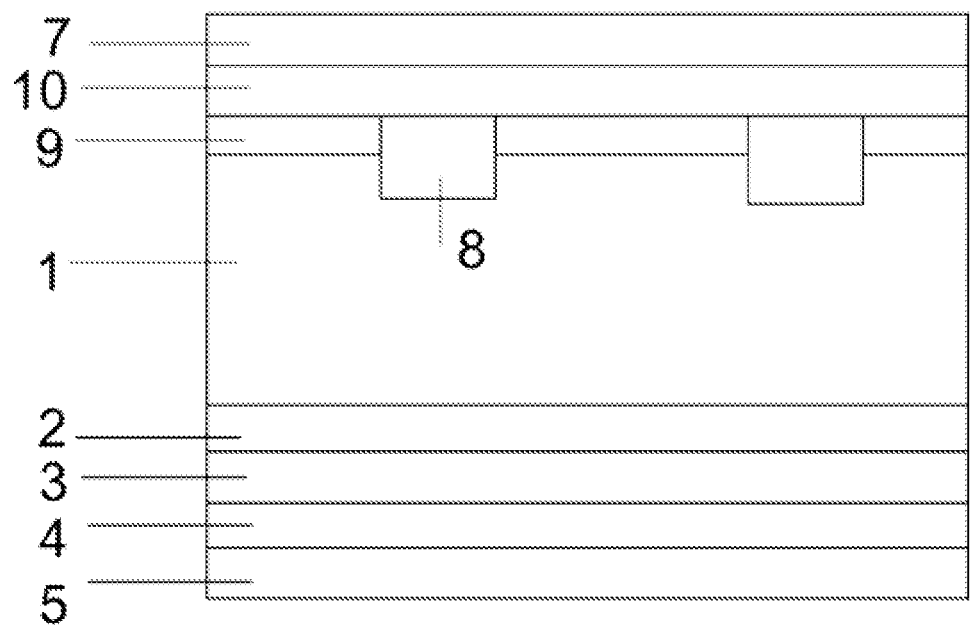
Figure 2:
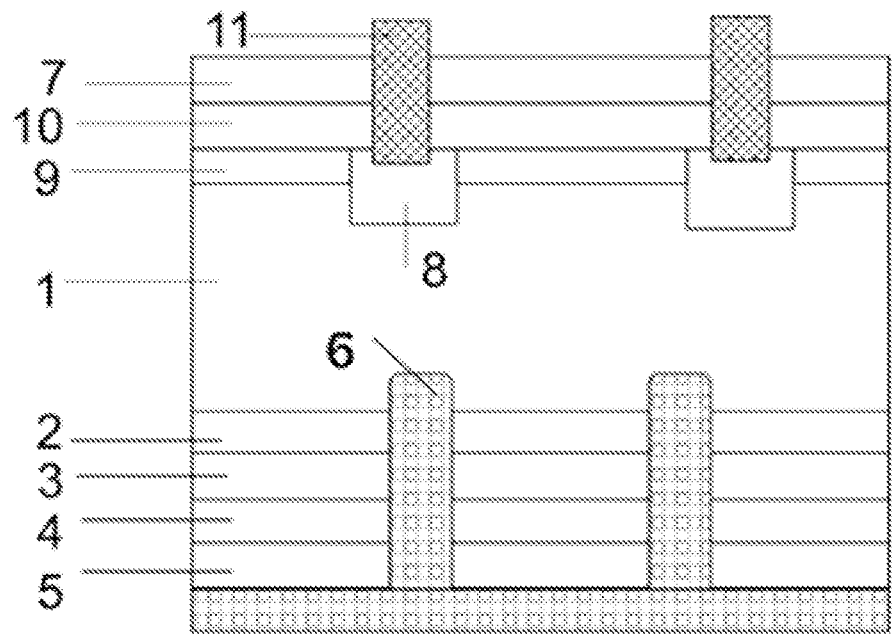

FIG. 2 shows a schematic cross-sectional view of the laminated passivation structure of solar cell provided in Example 1 (the front surface of the cell is a textured structure, and is intentionally drawn as a plane for simple illustration)

wherein:
1—P-type silicon substrate,
2—first dielectric layer,
3—second dielectric layer,
4—third dielectric layer,
5—fourth dielectric layer,
6—aluminum back field,
7—sixth dielectric layer,
8—$N^{++}$ heavily diffused region,
9—$N^+$ lightly diffused region,
10—fifth dielectric layer,
11—front Ag electrode.

Figure 3:
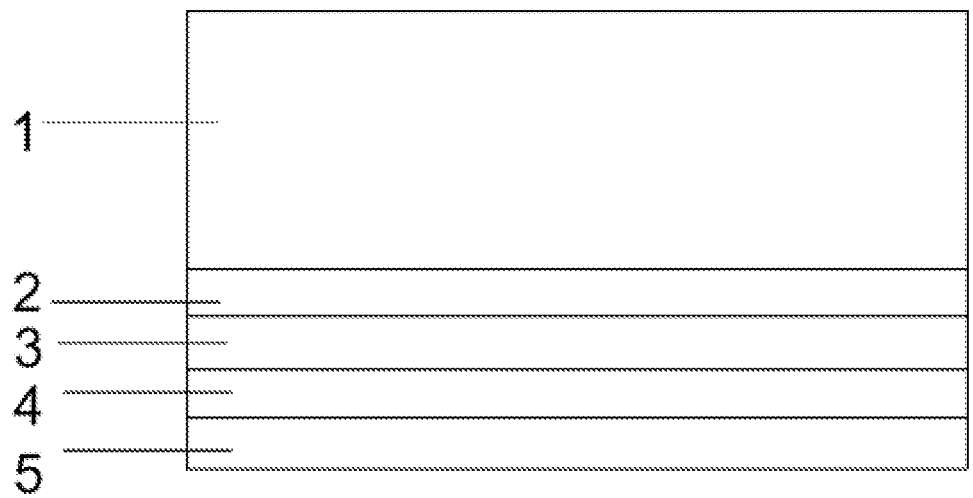

FIG. 3 shows a schematic cross-sectional view of the back laminated passivation structure of solar cell provided in Example 1 (the front surface of the cell is a textured structure, and is intentionally drawn as a plane for simple illustration)

wherein:
1—P-type silicon substrate,
2—first dielectric layer,
3—second dielectric layer,
4—third dielectric layer,
5—fourth dielectric layer.

DETAILED DESCRIPTION OF THE EMBODIMENTS

In order to better explain the present application and facilitate the understanding of the technical solutions of the present application, the present application will be further described in detail below. However, the following examples are only simple examples of the present application, and do not represent or limit the protection scope of the claims of the present application, which is subject to the claims.

In the present application, as a specific embodiment, the laminated passivation structure of solar cell comprises a P-type silicon substrate, and the back surface of the P-type silicon substrate is sequentially provided with a first $SiO_2$ film, an $Al_2O_3$ layer, a $SiO_xN_y$ film and a first $SiN_x$ film from inside to outside. An aluminum back field passes through the first $SiN_x$ film, the $SiO_xN_y$ film, the $Al_2O_3$ layer and the first $SiO_2$ film in sequence and then connects with the P-type silicon substrate.

The first $SiO_2$ film has a thickness of 1 to 10 nm, the $Al_2O_3$ layer is deposited by a PECVD method or an ALD method, and has a thickness of 1 to 50 nm, the $SiO_xN_y$ film is deposited by a PECVD method, and has a thickness of 1 to 80 nm, and the first $SiN_x$ film is a $SiN_x$ film deposited by a PECVD method, and has a thickness of 20 to 150 nm.

As an optional embodiment, the first $SiO_2$ film has a thickness of 1 to 5 nm, the $Al_2O_3$ layer is deposited by a PECVD method or an ALD method, and has a thickness of 1 to 50 nm, the $SiO_xN_y$ film is deposited by a PECVD method, and has a thickness of 1 to 80 nm, and the first $SiN_x$ film is a $SiN_x$ film deposited by a PECVD method, and has a thickness of 20 to 150 nm.

The front surface of the P-type silicon substrate is sequentially provided with a $N^{++}$ heavily diffused region, a $N^+$ lightly diffused region, a second $SiO_2$ film, and a second $SiN_x$ film from inside to outside.

In this embodiment, the laminated film on the back surface of the P-type silicon substrate contains a large amount of $H^+$, which will be injected into the surface and the interior of the silicon wafer during the subsequent annealing process or sintering process to passivate the recombination center. The laminated passivation film has strong field effect passivation, and the superposition of both has a very good passivation effect.

As another specific embodiment, the laminated passivation structure of solar cell comprises a P-type silicon substrate, and the back surface of the P-type silicon substrate is sequentially provided with a first $SiO_2$ film, an $Al_2O_3$ layer, a $SiO_xN_y$ film and a first $SiN_x$ film from inside to outside. An aluminum back field passes through the first $SiN_x$ film, the $SiO_xN_y$ film, the $Al_2O_3$ layer and the first $SiO_2$ film in sequence and then connects with the P-type silicon substrate.

Specifically, 47% by volume of a potassium hydroxide (KOH) solution is used to remove the mechanical damaged layer of the P-type silicon wafer by 2 to 3 µm, and then 47% by volume of a KOH solution is used to etch the surface of the silicon wafer to form a pyramid structure of 2 to 3 µm.

$POCL_3$ liquid-low-pressure diffusion is used to form a lightly diffused region, the diffusion temperature is 810° C., the process time is 90 min, and the diffusion sheet resistance is controlled as 120 to 170 ohm/sq.

Laser selective emitter (SE) doping, the phosphorous atoms in the phosphorosilicate glass after the diffusion is laser doped by the high temperature of laser to form a local $N^{++}$ heavily diffused region, and the diffusion sheet resistance is 50 to 100 ohm/sq.

The back junction is removed by a chain cleaning machine, and the back surface of the silicon wafer is polished by 3 to 4 µm to remove the peripheral p-n junction.

Oxidation is conducted on the back surface, the front surface, and the edges of the silicon wafer to generate thin $SiO_2$ films, which are the first $SiO_2$ film and the second $SiO_2$ film with a thickness of 1 to 5 nm.

The back-surface $Al_2O_3$ layer is deposited by PECVD, with a thickness of 1 to 50 nm.

The back-surface $SiO_xN_y$ film is deposited by PECVD, with a thickness of 5 to 30 nm.

The back-surface first $SiN_x$ film is deposited by PECVD, with a thickness of 4 to 100 nm.

The front-surface second $SiN_x$ film is deposited by PECVD method, with a thickness of 50 to 100 nm.

A 532 nm ns laser is used to make local grooving on the back laminated film to open the laminated passivation film.

After a back Ag electrode is printed and dried, a back Al paste is then printed to form an aluminum back field. A front Ag cell is printed and quickly sintered at 875° C. to form a good ohmic contact, tested and sorted.

As yet another specific embodiment, the laminated passivation structure of solar cell comprises a P-type silicon substrate, and the back surface of the P-type silicon substrate is sequentially provided with a first $SiO_2$ film, an $Al_2O_3$ layer, a $SiO_xN_y$ film and a first $SiN_x$ film from inside to outside. An aluminum back field passes through the first $SiN_x$ film, the $SiO_xN_y$ film, the $Al_2O_3$ layer and the first $SiO_2$ film in sequence and then connects with the P-type silicon substrate 1.

Specifically, 47% by volume of a KOH solution is used to remove the mechanical damaged layer of the P-type silicon wafer by 3 µm, and then 47% by volume of a KOH solution is used to etch the surface of the silicon wafer to form a pyramid structure of 2 to 3 µm.

$POCL_3$ liquid-low-pressure diffusion is used to form a p-n junction, i.e. a $N^+$ lightly diffused region, the diffusion temperature is 810° C., the process time is 90 min, and the diffusion sheet resistance is controlled as 150 to 170 ohm/sq.

Laser SE doping, the phosphorous atoms in the phosphorosilicate glass after the diffusion is laser doped by the high temperature of laser to form a local heavily doped region, and the diffusion sheet resistance is 40 to 100 ohm/sq.

The back junction is removed by a chain cleaning machine, and the back surface of the silicon wafer is polished by 3 to 4 µm to remove the peripheral p-n junction.

Oxidation is conducted on the back surface, the front surface, and the edges of the silicon wafer to generate thin $SiO_2$ films, which are the first $SiO_2$ film and the second $SiO_2$ film with a thickness of 1 to 10 nm.

The back-surface $Al_2O_3$ layer is deposited by ALD, with a thickness of 5 to 50 nm.

The back-surface $SiO_xN_y$ film and the first $SiN_x$ film are sequentially deposited by PECVD, with thicknesses of 5 to 50 nm and 40 to 100 nm, respectively.

The front-surface $SiN_x$ film is deposited by PECVD, with a thickness of 20 to 120 nm.

A 532 nm ns laser is used to make local grooving on the back laminated film to open the laminated passivation film.

After a back Ag electrode is printed and dried, a back Al paste is then printed to form an aluminum back field. A front Ag cell is printed and quickly sintered at 875° C. to form a good ohmic contact, tested and sorted.

The following are typical but non-limiting examples of the present application:

Example 1

This example provides a laminated passivation structure of solar cell, as shown in FIG. 2 and FIG. 3. The passivation structure of solar cell includes a P-type silicon substrate 1, and the back surface of the P-type silicon substrate 1 is sequentially provided with a first dielectric layer 2, a second dielectric layer 3, a third dielectric layer 4, and a fourth dielectric layer 5, an aluminum back field connecting with the P-type silicon substrate 1 after passing through the fourth dielectric layer 5, the third dielectric layer 4, the second dielectric layer 3 and the first dielectric layer 2 in sequence, a $N^{++}$ heavily diffused region 8, a $N^+$ lightly diffused region 9, a fifth dielectric layer 10 and a sixth dielectric layer 7 sequentially arranged on the front surface of the P-type silicon substrate 1 from inside to outside. The laminated passivation structure of solar cell provided in this example further includes a front Ag electrode 11, and the front Ag electrode 11 passes through the sixth dielectric layer 7 and the fifth dielectric layer 10 into the $N^{++}$ heavily diffused region 8.

In the laminated passivation structure of solar cell provided in this example, the first dielectric layer 2 is a silicon oxide film with a thickness of 2 nm, the second dielectric layer 3 is an aluminum oxide film with a thickness of 10 nm, the third dielectric layer 4 is a silicon oxynitride laminated film with a total thickness of 8 nm and a refractive index of 1.8, the fourth dielectric layer 5 is a silicon nitride laminated film with a total thickness of 60 nm and a refractive index of 2.1, the diffusion sheet resistance of the $N^+$ lightly diffused region 9 is 150 ohm/sq, the diffusion sheet resistance of the $N^{++}$ heavily diffused region 8 is 75 ohm/sq, the fifth dielectric layer 10 is a silicon oxide film with a thickness of 2 nm, and the sixth dielectric layer 7 is a silicon nitride film with a thickness of 75 nm and a refractive index of 2.0.

The third dielectric layer 4 is a three-layer silicon oxynitride laminated film, and along the direction away from the P-type silicon substrate 1 there are a first film of the third dielectric layer 4, a second film of the third dielectric layer 4, and a third film of the third dielectric layer 4, respectively. The refractive index of the first film of the third dielectric layer 4 is 1.7, the refractive index of the second film of the third dielectric layer 4 is 1.8, and the refractive index of the third film of the third dielectric layer 4 is 1.9.

The fourth dielectric layer 5 is a three-layer silicon nitride laminated film, and along the direction away from the P-type silicon substrate 1 there are a first film of the fourth dielectric layer 5, a second film of the fourth dielectric layer 5, and a third film of the fourth dielectric layer 5, respectively. The refractive index of the first film of the fourth dielectric layer 5 is 2.0, the refractive index of the second film of the fourth dielectric layer 5 is 2.1, and the refractive index of the third film of the fourth dielectric layer 5 is 2.2.

In the laminated passivation structure of solar cell provided in this example, the $N^+$ light diffusion region 9 is obtained by a tubular liquid phosphorous source diffusion, and the $N^{++}$ heavily diffused region 8 is obtained by laser doping.

A method for preparing the laminated passivation structure of solar cell provided in this example is also provided, and the specific steps include:

(1) Using 2% by mass of a KOH solution to remove the mechanical damaged layer of the P-type silicon wafer by 1.5 μm, and then using 3% by mass of a KOH solution to etch the surface of the silicon wafer to form a pyramid structure with a size of 1.5 μm.

(2) Using $POCl_3$ liquid diffusion to form a $N^+$ lightly diffused region 9, with the diffusion temperature being 810° C., and the process time being 90 min.

(3) Laser SE doping, laser doping the phosphorous atoms in the phosphorosilicate glass after the diffusion by the high temperature of laser to form a local $N^{++}$ heavily diffused region 8.

(4) Removing the back junction by a chain cleaning machine, and polishing the back surface of the silicon wafer by 3.5 μm to remove the peripheral p-n junction.

(5) Generating thin silicon oxide films on the back surface, the front surface, and the edges of the silicon wafer by thermal oxidation, i.e. the first dielectric layer 2 and the fifth dielectric layer 10, with a thickness of 2 nm.

(6) Depositing an aluminum oxide film on the back surface by PECVD, i.e. the second dielectric layer 3; depositing a silicon oxynitride film on the back surface by PECVD, i.e. the third dielectric layer 4; depositing a silicon nitride film on the back surface by PECVD, i.e. the fourth dielectric layer 5.

(7) Depositing a silicon nitride film on the front surface by PECVD, i.e. the sixth dielectric layer 7.

(8) Using a 532 nm ns laser to make local grooving on the back laminated film to open the laminated passivation film.

(9) After printing a back Ag paste and drying, and then printing a back Al paste 6 and drying, printing a front Ag paste 11 and quickly sintering at 875° C. to form a good ohmic contact.

FIG. 1A, FIG. 1B, FIG. 1C, FIG. 1D, FIG. 1E, FIG. 1F, FIG. 1G, and FIG. 1H are schematic diagrams of solar cells in different stages according to the above-mentioned preparation methods.

Example 2

The laminated passivation structure of solar cell provided in this example refers to Example 1, and the differences lie in that the first dielectric layer 2 is a silicon oxide/silicon oxynitride laminated film with a thickness of 3 nm, the second dielectric layer 3 is an aluminum oxide film with a thickness of 10 nm, the third dielectric layer 4 is a laminated film consisting of a silicon oxynitride film, a silicon nitride film and a silicon carbide film with a total thickness of 20 nm and a refractive index of 1.8, the fourth dielectric layer is a laminated film consisting of a silicon carbide film, a silicon oxynitride film, and a silicon nitride film with a total thickness of 60 nm and a refractive index of 2.1, the diffusion sheet resistance of the $N^+$ lightly diffused region 9 is 150 ohm/sq, the diffusion sheet resistance of the $N^{++}$ heavily diffused region 8 is 75 ohm/sq, the fifth dielectric layer 10 is a silicon oxide film with a thickness of 2.5 nm, and the sixth dielectric layer 7 is a silicon nitride film with a thickness of 75 nm and a refractive index of 2.0.

The third dielectric layer 4 is a laminated film consisting of a silicon oxynitride film, a silicon nitride film and a silicon carbide film, and along the direction away from the P-type silicon substrate 1 there are a first film of the third dielectric layer 4 (a silicon oxynitride film), a second film of the third dielectric layer 4 (a silicon nitride film), and a third film of the third dielectric layer 4 (a silicon carbide film), respectively. The refractive index of the first film of the third dielectric layer 4 is 1.7, the refractive index of the second film of the third dielectric layer 4 is 1.9 and the refractive index of the third film of the third dielectric layer 4 is 2.0.

The fourth dielectric layer 5 is a laminated film consisting of a silicon carbide film, a silicon oxynitride film, and a silicon nitride film, and along the direction away from the P-type silicon substrate 1 there are a first film of the fourth dielectric layer 5 (a silicon carbide film), a second film of the fourth dielectric layer 5 (a silicon oxynitride film), and a third film of the fourth dielectric layer 5 (a silicon nitride film), respectively. The refractive index of the first film of the fourth dielectric layer 5 is 2.05, the refractive index of the second film of the fourth dielectric layer 5 is 2.1 and the refractive index of the third film of the fourth dielectric layer 5 is 2.15.

A method for preparing the laminated passivation structure of solar cell provided in this example is also provided, and the specific steps include:

(1) Using 2% by mass of a KOH solution to remove the mechanical damaged layer of the P-type silicon wafer by 1.5 μm, and then using 3% by mass of a KOH solution to etch the surface of the silicon wafer to form a pyramid structure with a size of 1.5 μm.

(2) Using $POCl_3$ liquid diffusion to form a $N^+$ lightly diffused region 9, with the diffusion temperature being 810° C., and the process time being 90 min.

(3) Laser SE doping, laser doping the phosphorous atoms in the phosphorosilicate glass after the diffusion by the high temperature of laser to form a local $N^{++}$ heavily diffused region 8.

(4) Removing the back junction by a chain cleaning machine, and polishing the back surface of the silicon wafer by 3.5 μm to remove the peripheral p-n junction.
(5) Generating thin silicon oxide films on the back surface, the front surface, and the edges of the silicon wafer by wet oxidation, i.e. the first dielectric layer 2 and the fifth dielectric layer 10, with a thickness of 1 nm, and depositing a silicon oxynitride film on the back surface by PECVD, i.e. the first dielectric layer 2, with a thickness of 2 nm.
(6) Depositing an aluminum oxide film on the back surface by PECVD, i.e. the second dielectric layer 3; depositing a silicon oxynitride film, a silicon nitride film and a silicon carbide film on the back surface by PECVD, i.e. the third dielectric layer 4; depositing a silicon carbide film, a silicon oxynitride film, and a silicon nitride film on the back surface by PECVD, i.e. the fourth dielectric layer 5.
(7) Depositing a silicon nitride film on the front surface by PECVD, i.e. the sixth dielectric layer 7.
(8) Using a 532 nm ns laser to make local grooving on the back laminated film to open the laminated passivation film.
(9) After printing a back Ag paste and drying, and then printing a back Al paste 6 and drying, printing a front Ag paste 11 and quickly sintering at 875° C. to form a good ohmic contact.

Example 3

The laminated passivation structure of solar cell provided in this example refers to Example 1, and the differences lie in that the first dielectric layer 2 is a silicon oxide film with a thickness of 2 nm, the second dielectric layer 3 is an aluminum oxide film with a thickness of 10 nm, the third dielectric layer 4 is a silicon oxynitride film with a thickness of 20 nm and a refractive index of 1.9, the fourth dielectric layer is a two-layer silicon nitride film with thicknesses of 20 nm and 40 nm, respectively, and refractive indexes of 2.0 and 2.1, respectively. The diffusion sheet resistance of the $N^+$ lightly diffused region 9 is 150 ohm/sq, the diffusion sheet resistance of the $N^{++}$ heavily diffused region 8 is 75 ohm/sq, the fifth dielectric layer 10 is a silicon oxide film with a thickness of 2.5 nm, and the sixth dielectric layer 7 is a silicon nitride film with a thickness of 75 nm and a refractive index of 2.0.

Comparative Example 1

The difference between this comparative example and Example 1 lies in that the laminated passivation structure of solar cell provided by this comparative example isn't provided with the first dielectric layer 2.

Comparative Example 2

The difference between this comparative example and Example 1 lies in that the laminated passivation structure of solar cell provided by this comparative example isn't provided with the third dielectric layer 4.

Comparative Example 3

The difference between this comparative example and Example 2 lies in that the first dielectric layer 2 of the laminated passivation structure of solar cell provided by this comparative example isn't provided with a silicon oxynitride layer, so that no laminated structure is formed.

Comparative Example 4

The difference between this comparative example and Example 3 lies in that the laminated passivation structure of solar cell provided by this comparative example isn't provided with the fourth dielectric layer 5 of the laminated structure, and the fourth dielectric layer is a silicon nitride film with a thickness of 60 nm and a refractive index of 2.1.

The results of cells in different solutions are shown in the table below:

TABLE 1

| | Open-circuit voltage [mV] | Short-circuit current [mA/cm2] | Fill factor [%] | Conversion efficiency [%] |
| --- | --- | --- | --- | --- |
| Example 1 | 694 | 40.81 | 81.5 | 23.08 |
| Comparative Example 1 | 692 | 40.78 | 81.45 | 22.98 |
| Comparative Example 2 | 691 | 40.71 | 81.4 | 22.90 |
| Example 2 | 694.5 | 40.85 | 81.5 | 23.12 |
| Comparative Example 3 | 693 | 40.79 | 81.45 | 23.02 |
| Example 3 | 694 | 40.90 | 81.5 | 23.13 |
| Comparative Example 4 | 694 | 40.81 | 81.5 | 23.08 |

The above efficiency test of the cells is under the standard test conditions: Irradiance 1000 W/m², Cell Temperature 25° C., Air Mass AM1.5.

Compared with Example 1, since Comparative Example 1 is not provided with the first dielectric layer 2, a weakened chemical passivation effect is resulted, the cell Voc is lowered by 2 mV and the efficiency is lowered by 0.1%.

Compared with Example 1, since Comparative Example 2 is not provided with the third dielectric layer 4, a weakened field passivation effect of the second dielectric layer and a weakened back light reflection effect are resulted at the same time, the open-circuit voltage of the cell is lowered by 3 mV, the current density is lowered by 0.1 mA/cm² and the efficiency is lowered by 0.18%.

Compared with Example 2, since Comparative Example 3 is not provided with the first dielectric layer 2 of the laminated structure, an unstable chemical passivation effect is resulted, the cell Voc is lowered by 1.5 mV and the efficiency is lowered by 0.1%.

Compared with Example 3, since Comparative Example 4 is not provided with the fourth dielectric layer 5 of the laminated structure, a weakened back light reflection effect is resulted, the current density is lowered by 0.09 mA/cm² and the efficiency is lowered by 0.05%.

Based on the above results, it can be seen that the laminated passivation structure of solar cell provided in Examples 1-3 has very good chemical passivation and field passivation effects.

The applicant declares that the present application illustrates the detailed methods of the present application through the above-mentioned examples, but the present application is not limited thereto, that is, it doesn't meant that the present application can only be implemented depending on the above-mentioned detailed methods.

What is claimed is:
1. A laminated passivation structured solar cell comprising a P-type silicon substrate, and a first dielectric layer having a first refractive index, a second dielectric layer having a second refractive index, a third dielectric layer having a third refractive index and a fourth dielectric layer having a fourth refractive index, wherein the first, second, third, and fourth dielectric layers are sequentially arranged on a back surface of the P-type silicon substrate from inside to outside, the third dielectric layer is a silicon oxynitride layer, the fourth dielectric layer includes a silicon nitride layer, and the third refractive index is smaller than the fourth refractive index.

2. The laminated passivation structured solar cell according to claim 1, wherein the first dielectric layer includes a silicon-containing layer.

3. The laminated passivation structured solar cell according to claim 1, wherein the first dielectric layer is a silicon oxide layer, a silicon oxynitride layer, or a combination thereof.

4. The laminated passivation structured solar cell according to claim 1, wherein the first dielectric layer has a thickness of about 1 to 10 nm.

5. The laminated passivation structured solar cell according to claim 1, wherein the second dielectric layer includes an aluminum-containing layer.

6. The laminated passivation structured solar cell according to claim 1, wherein the second dielectric layer is an aluminum oxide layer.

7. The laminated passivation structured solar cell according to claim 1, wherein the second dielectric layer has a thickness of about 1 to 60 nm.

8. The laminated passivation structured solar cell according to claim 1, wherein the second dielectric layer is deposited by a plasma enhanced chemical vapor disposition (PECVD) method or an atomic layer disposition (ALD) method, with a thickness of about 1 to 50 nm.

9. The laminated passivation structured solar cell according to claim 1, wherein the third dielectric layer has a thickness of about 1 to 80 nm.

10. The laminated passivation structured solar cell according to claim 1, wherein the third dielectric layer is deposited by a plasma enhanced chemical vapor disposition (PECVD) method with a thickness of about 1 to 80 nm.

11. The laminated passivation structured solar cell according to claim 1, wherein the third refractive index is about 1.5 to 2.4.

12. The laminated passivation structured solar cell according to claim 1, wherein the fourth dielectric layer further includes a silicon oxide layer, a silicon oxynitride layer, and a silicon carbide layer.

13. The laminated passivation structured solar cell according to claim 1, wherein the fourth dielectric layer has a thickness of about 1 to 200 nm.

14. The laminated passivation structured solar cell according to claim 1, wherein the fourth dielectric layer is deposited by a plasma enhanced chemical vapor disposition (PECVD) method, and has a thickness of about 20 to 150 nm.

15. The laminated passivation structured solar cell according to claim 1, wherein the fourth refractive index is about 1.5 to 2.4.

16. The laminated passivation structured solar cell according to claim 1, wherein the fourth dielectric layer is a laminated film structure having first and second laminated film layers with respective first and second laminated film layer refractive indexes, and the first laminated film layer refractive index is different than the second laminated film layer refractive index.

17. The laminated passivation structured solar cell according to claim 16, wherein the first laminated film layer is the silicon nitride layer and the first laminated film layer refractive index is about 1.6 to 2.2 and the second laminated film layer is a silicon nitride layer and the second laminated film layer refractive index is about 1.9 to 2.4.

18. The laminated passivation structured solar cell according to claim 16, wherein the first laminated film layer is a silicon oxynitride layer and the first laminated film layer refractive index is about 1.6 to 2.2 and the second laminated film layer is the silicon nitride layer and the second laminated film layer refractive index is about 1.9 to 2.4.

19. The laminated passivation structured solar cell according to claim 16, wherein in the laminated film structure of the fourth dielectric layer, along a direction away from the P-type silicon substrate, the respective refractive indexes of each of the first and second laminated film layers increase in sequence.

20. The laminated passivation structured solar cell according to claim 1, wherein the first dielectric layer is a $SiO_2$ film, the second dielectric layer is an $Al_2O_3$ layer, and the fourth dielectric layer is the silicon nitride layer.

21. The laminated passivation structured solar cell according to claim 20, wherein the thickness of the $SiO_2$ film is 1 to 10 nm.

22. The laminated passivation structured solar cell according to claim 20, wherein the $Al_2O_3$ layer is deposited by a plasma enhanced chemical vapor disposition (PECVD) method or an atomic layer disposition (ALD) method, and has a thickness of 1 to 50 nm.

23. The laminated passivation structured solar cell according to claim 20, wherein the silicon oxynitride layer is deposited by a plasma enhanced chemical vapor disposition (PECVD) method, and has a thickness of 1 to 80 nm.

24. The laminated passivation structured solar cell according to claim 20, wherein the silicon nitride layer is deposited by a plasma enhanced chemical vapor disposition (PECVD) method, and has a thickness of 20 to 150 nm.

25. The laminated passivation structured solar cell according to claim 20, wherein the $SiO_2$ film has a thickness of 1 to 5 nm, the $Al_2O_3$ layer is deposited by a plasma enhanced chemical vapor disposition (PECVD) method or an atomic layer disposition (ALD) method, and has a thickness of 1 to 50 nm, the silicon oxynitride layer is deposited by a PECVD method, and has a thickness of 1 to 80 nm, and the silicon nitride layer is deposited by a PECVD method, and has a thickness of 20 to 150 nm.

26. The laminated passivation structured solar cell according to claim 1, wherein the first dielectric layer is a silicon oxide layer with a thickness of 1 to 10 nm, the second dielectric layer is an aluminum oxide layer with a thickness of 1 to 60 nm, the third dielectric layer has a thickness of 1 to 80 nm, and the fourth dielectric layer is the silicon nitride layer with a thickness of 1 to 100 nm.

27. The laminated passivation structured solar cell according to claim 1, further comprising a $N^{++}$ heavily diffused region, a $N^+$ lightly diffused region, a fifth dielectric layer and a sixth dielectric layer, sequentially arranged on the front surface of the P-type silicon substrate from inside to outside.

28. The laminated passivation structured solar cell according to claim 27, wherein the fifth dielectric layer is a silicon oxide layer.

29. The laminated passivation structured solar cell according to claim 27, wherein the thickness of the fifth dielectric layer is 1 to 10 nm.

30. The laminated passivation structured solar cell according to claim 27, wherein the sixth dielectric layer is any one or a combination of at least two of a silicon oxide layer, a silicon oxynitride layer, and a silicon carbide layer.

31. The laminated passivation structured solar cell according to claim 27, wherein the thickness of the sixth dielectric layer is 50 to 150 nm.

32. The laminated passivation structured solar cell according to claim 27, further comprising a front Ag electrode in contact with the $N^{++}$ heavily diffused region through the sixth dielectric layer, and the fifth dielectric layer.

33. The laminated passivation structured solar cell according to claim 1, further comprising an aluminum back field connecting with the P-type silicon substrate after passing through the first dielectric layer, the second dielectric layer, the third dielectric layer, and the fourth dielectric layer in sequence.

34. A method for preparing the laminated passivation structured solar cell according to claim 1, wherein the method comprises:
removing a back junction of the P-type silicon substrate, and polishing the back surface of the P-type silicon substrate; and
generating the first dielectric layer on the back surface of the P-type silicon substrate, and then sequentially depositing the second dielectric layer, the third dielectric layer and the fourth dielectric layer on the first dielectric layer.

35. The method according to claim 34, wherein the first dielectric layer is formed by a growth method that includes any one or a combination of at least two of a thermal oxidation method, a solution method, and a plasma enhanced chemical vapor disposition (PECVD) method.

36. The method according to claim 34, wherein the second dielectric layer is deposited by a plasma enhanced chemical vapor disposition (PECVD) method or an atomic layer disposition (ALD) method.

37. The method according to claim 34, wherein the third dielectric layer is deposited by a plasma enhanced chemical vapor disposition (PECVD) method.

38. The method according to claim 34, wherein the fourth dielectric layer is deposited by a plasma enhanced chemical vapor disposition (PECVD) method.

39. The method according to claim 34, further comprising: preparing a $N^{++}$ heavily diffused region and a $N^+$ lightly diffused region, and depositing a fifth dielectric layer and a sixth dielectric layer.

40. The method according to claim 39, wherein the fifth dielectric layer is deposited by a plasma enhanced chemical vapor disposition (PECVD) method.

41. The method according to claim 39, wherein the sixth dielectric layer is deposited by a plasma enhanced chemical vapor disposition (PECVD) method.

42. A method for preparing a laminated passivation structured solar cell having a P-type silicon substrate, and a first dielectric layer, a second dielectric layer, a third dielectric layer and a fourth dielectric layer sequentially arranged on the back surface of the P-type silicon substrate from inside to outside, the method comprising:
removing a mechanical damaged layer of a P-type silicon substrate with an alkaline etching solution, and then etching the surface of the silicon substrate by use of the alkaline etching solution to form a pyramid structure on the front surface of the P-type silicon substrate;
after that, performing diffusion to form a $N^+$ lightly diffused region on the front surface of the P-type silicon substrate, and performing laser doping to obtain a $N^{++}$ heavily diffused region;
removing the back junction of the P-type silicon substrate, and polishing the back surface of the P-type silicon substrate;
oxidation generating a first dielectric layer and a fifth dielectric layer on the P-type silicon substrate, and then sequentially depositing a second dielectric layer, a third dielectric layer and a fourth dielectric layer on the first dielectric layer, and depositing a sixth dielectric layer on the fifth dielectric layer;
printing a back Ag electrode and drying, then printing a back Al paste to form an aluminum back field, and printing a front Ag electrode.

43. A laminated passivation structured solar cell comprising a P-type silicon substrate, and a first dielectric layer having a first refractive index, a second dielectric layer having a second refractive index, a third dielectric layer having a third refractive index and a fourth dielectric layer having a fourth refractive index, wherein the first, second, third, and fourth dielectric layers are sequentially arranged on a back surface of the P-type silicon substrate from inside to outside, the third dielectric layer includes a silicon oxynitride layer, the fourth dielectric layer includes a silicon carbide layer, and the third refractive index is smaller than the fourth refractive index.

* * * * *